(12) United States Patent
Chen et al.

(10) Patent No.: US 10,141,921 B2
(45) Date of Patent: Nov. 27, 2018

(54) SIGNAL GENERATOR USING MULTI-SAMPLING AND EDGE COMBINING AND ASSOCIATED SIGNAL GENERATING METHOD

(71) Applicant: MEDIATEK INC., Hsin-Chu (TW)

(72) Inventors: Pang-Ning Chen, Taipei (TW); Yu-Li Hsueh, New Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/378,056

(22) Filed: Dec. 14, 2016

(65) Prior Publication Data

US 2017/0207779 A1 Jul. 20, 2017

Related U.S. Application Data

(60) Provisional application No. 62/280,156, filed on Jan. 19, 2016.

(51) Int. Cl.
| | | |
|---|---|---|
| *H03L 7/06* | (2006.01) | |
| *H03K 5/145* | (2006.01) | |
| *H03B 5/32* | (2006.01) | |
| *H03K 5/19* | (2006.01) | |
| *H03K 19/21* | (2006.01) | |
| *H03L 7/089* | (2006.01) | |
| *H03L 7/099* | (2006.01) | |
| *G06F 1/02* | (2006.01) | |
| *G06F 1/08* | (2006.01) | |

(52) U.S. Cl.
CPC .............. *H03K 5/145* (2013.01); *G06F 1/022* (2013.01); *G06F 1/08* (2013.01); *H03B 5/32* (2013.01); *H03K 5/19* (2013.01); *H03K 19/21* (2013.01); *H03L 7/0891* (2013.01); *H03L 7/099* (2013.01)

(58) Field of Classification Search
CPC ...................................................... H03K 5/145
See application file for complete search history.

(56) References Cited

U.S. PATENT DOCUMENTS

| | | | |
|---|---|---|---|
| 6,087,864 A | 7/2000 | Aoki | |
| 6,198,317 B1 * | 3/2001 | Chow | ................ H03K 3/0307 327/116 |
| 6,369,622 B1 | 4/2002 | Lim | |
| 6,480,045 B2 | 11/2002 | Albean | |
| 2003/0017812 A1 | 1/2003 | Arimura | |

* cited by examiner

*Primary Examiner* — Daniel Puentes
(74) *Attorney, Agent, or Firm* — Winston Hsu

(57) ABSTRACT

A signal generator generates an output signal according to an oscillating signal. The signal generator has a plurality of edge sampling circuits and an edge combining circuit. Each of the edge sampling circuits receives the oscillating signal, samples the oscillating signal to obtain at least one of a rising edge and a falling edge in one cycle of the oscillating signal, and outputs a sampled signal using the at least one of the rising edge and the falling edge. The edge combining circuit combines a plurality of sampled signals generated by the edge sampling circuits, respectively, to generate the output signal.

20 Claims, 17 Drawing Sheets

SIGNAL GENERATOR USING MULTI-SAMPLING AND EDGE COMBINING AND ASSOCIATED SIGNAL GENERATING METHOD

CROSS REFERENCE TO RELATED APPLICATIONS

This application claims the benefit of U.S. provisional application No. 62/280,156, filed on Jan. 19, 2016 and incorporated herein by reference.

BACKGROUND

The disclosed embodiments of the present invention relate to generating an output signal, and more particularly, to a signal generator using multi-sampling and edge combining and an associated signal generating method.

The performance of frequency synthesizers, such as phase-locked loops (PLLs), relies on a clean fixed reference frequency, which is usually derived from a crystal oscillator. Unfortunately, typical low-cost crystal oscillators are able to provide low-frequency oscillating signals only. In general, a higher reference frequency would result in better noise performance for frequency synthesizers. Therefore, it is desired to multiply the reference frequency and at the same time to preserve the clean crystal oscillator properties (e.g., good noise properties).

SUMMARY

In accordance with exemplary embodiments of the present invention, a signal generator using multi-sampling and edge combining and an associated signal generating method are proposed.

According to a first aspect of the present invention, an exemplary signal generator for generating an output signal according to an oscillating signal is disclosed. The exemplary signal generator includes a plurality of edge sampling circuits and an edge combining circuit. Each of the edge sampling circuits is configured to receive the oscillating signal, sample the oscillating signal to obtain at least one of a rising edge and a falling edge in one cycle of the oscillating signal, and output a sampled signal using the at least one of the rising edge and the falling edge. The edge combining circuit is configured to combine a plurality of sampled signals generated by the edge sampling circuits, respectively, to generate the output signal.

According to a second aspect of the present invention, an exemplary signal generating method for generating an output signal according to an oscillating signal is disclosed. The exemplary signal generating method includes: performing a plurality of edge sampling operations upon the oscillating signal, respectively, wherein each of the edge sampling operations includes a step of sampling the oscillating signal to obtain at least one of a rising edge and a falling edge in one cycle of the oscillating signal, and a step of outputting a sampled signal using the at least one of the rising edge and the falling edge; and combining a plurality of different sampled signals generated by the edge sampling operations, respectively, to generate the output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
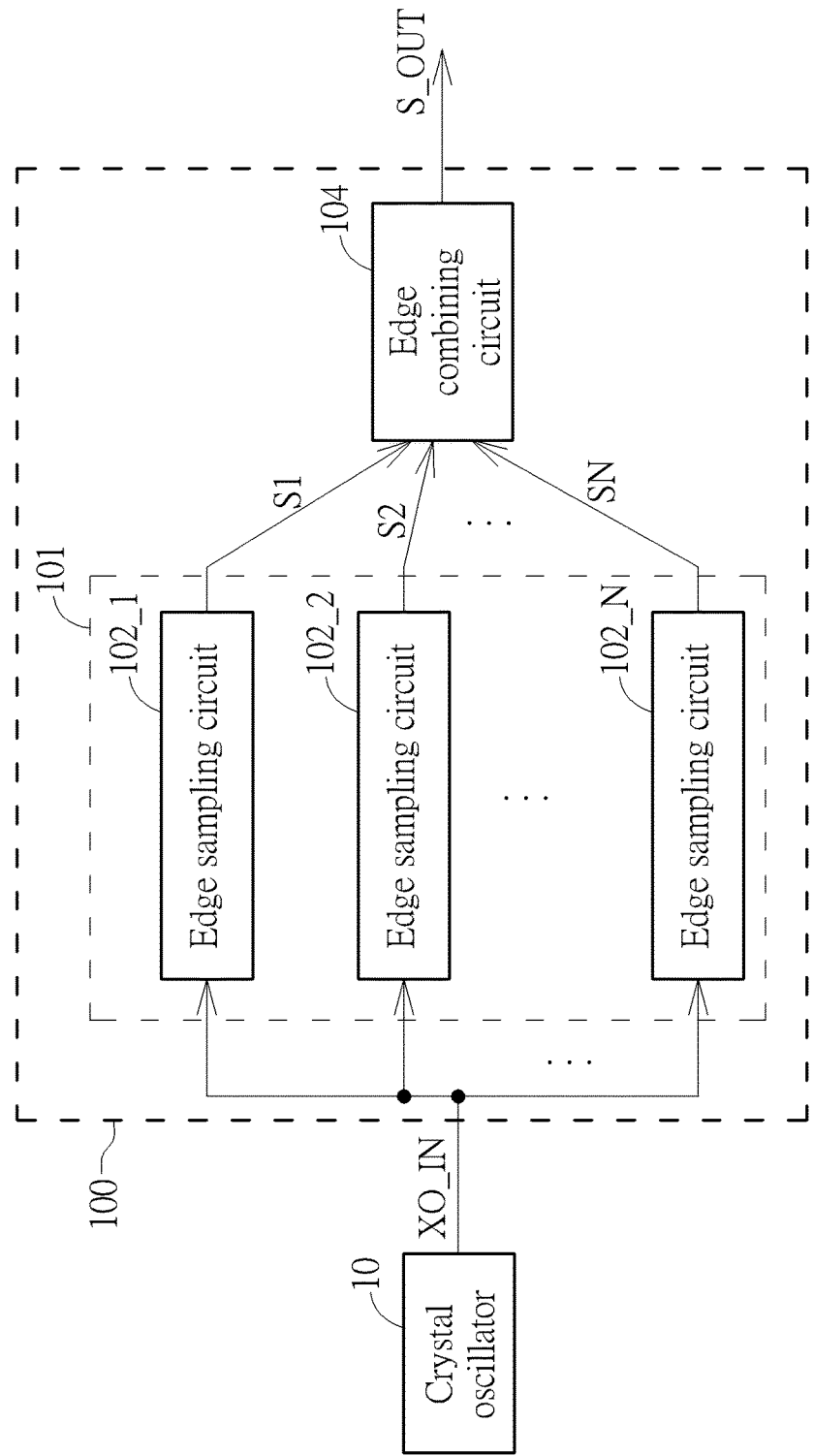
FIG. 1 is a block diagram illustrating a first signal generator according to an embodiment of the present invention.

FIG. 1 is a block diagram illustrating a first signal generator according to an embodiment of the present invention. The signal generator 100 receives an oscillating signal XO_IN from a clock source (e.g., a crystal oscillator 10), and processes the oscillating signal XO_IN to supply an output signal S_OUT to a following processing circuit (e.g., a phase-locked loop (PLL)). By way of example, but not limitation, the signal generator 100 may be configured to serve as a frequency multiplier needed by an application. As shown in FIG. 1, the signal generator 100 includes multiple edge sampling circuits 102_1, 102_2, . . . , 102_N and one edge combining circuit 104, where N is a positive integer larger than 1 (i.e., N≥2). In this embodiment, the edge sampling circuits 102_1-102_N form a crystal multi-sampling circuit 101 that is configured to generate multiple sampled signals S1-SN according to the oscillating signal XO_IN. That is, the crystal multi-sampling circuit 101 generates more than one sampled signal to the edge combining circuit 104. In this embodiment, each of the edge sampling circuits 102_1-102_N is configured to receive the oscillating signal XO_IN, sample a waveform of the oscillating signal XO_IN to obtain at least one of a rising edge and a falling edge (e.g., a set of a rising edge and a falling edge) in one cycle of the oscillating signal XO_IN, and output a corresponding sampled signal using the at least one of the rising edge and the falling edge (e.g., the set of the rising edge and the falling edge). Since the edge sampling is performed once during each cycle of the oscillating signal XO_IN, there is a set of a rising edge and a falling edge occurring in each period of the sampled signal.

Figure 4:
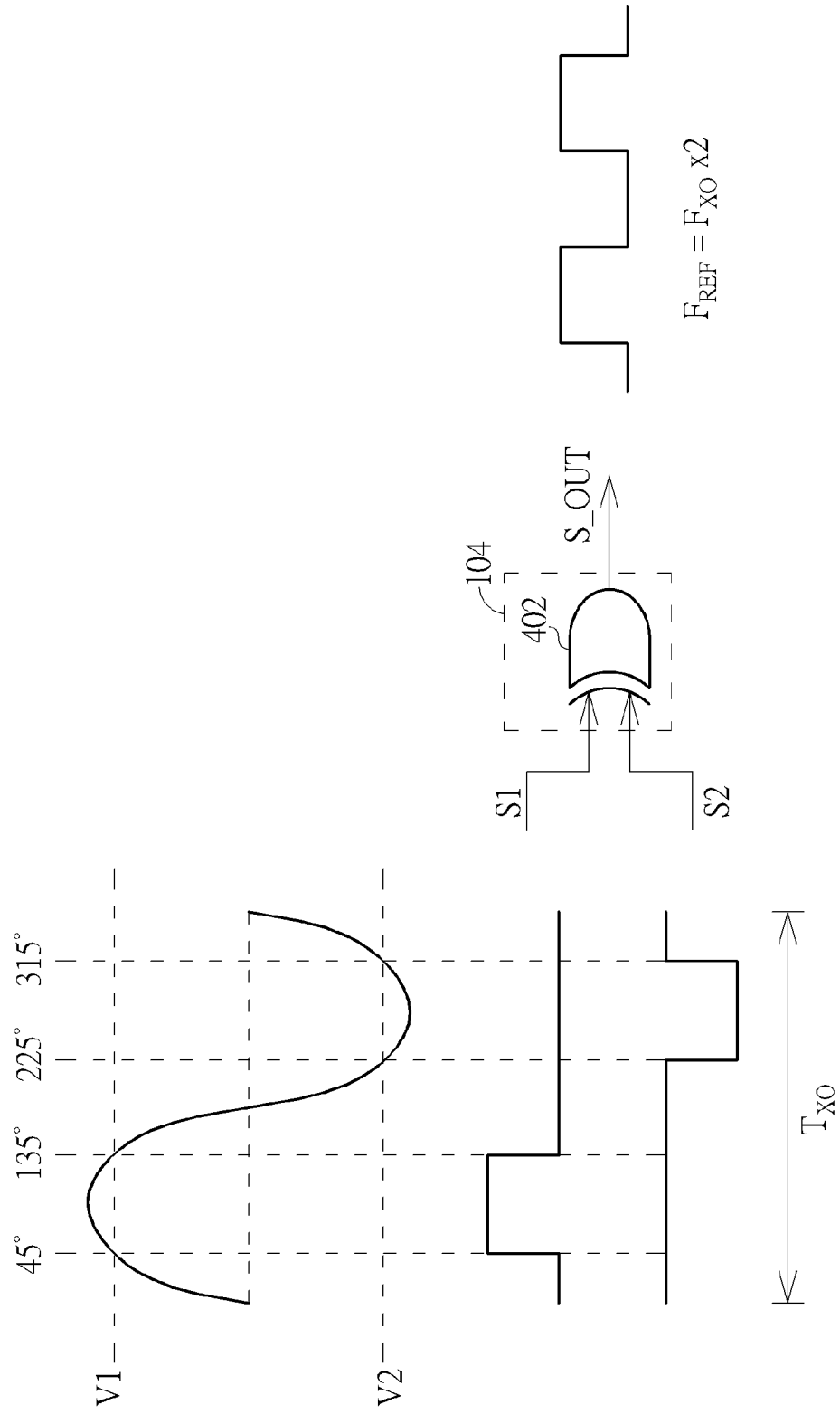
FIG. 4 is a diagram illustrating an edge combination example of generating an output signal with a frequency value that is two times as large as a frequency value of an oscillating signal.
Figure 5:
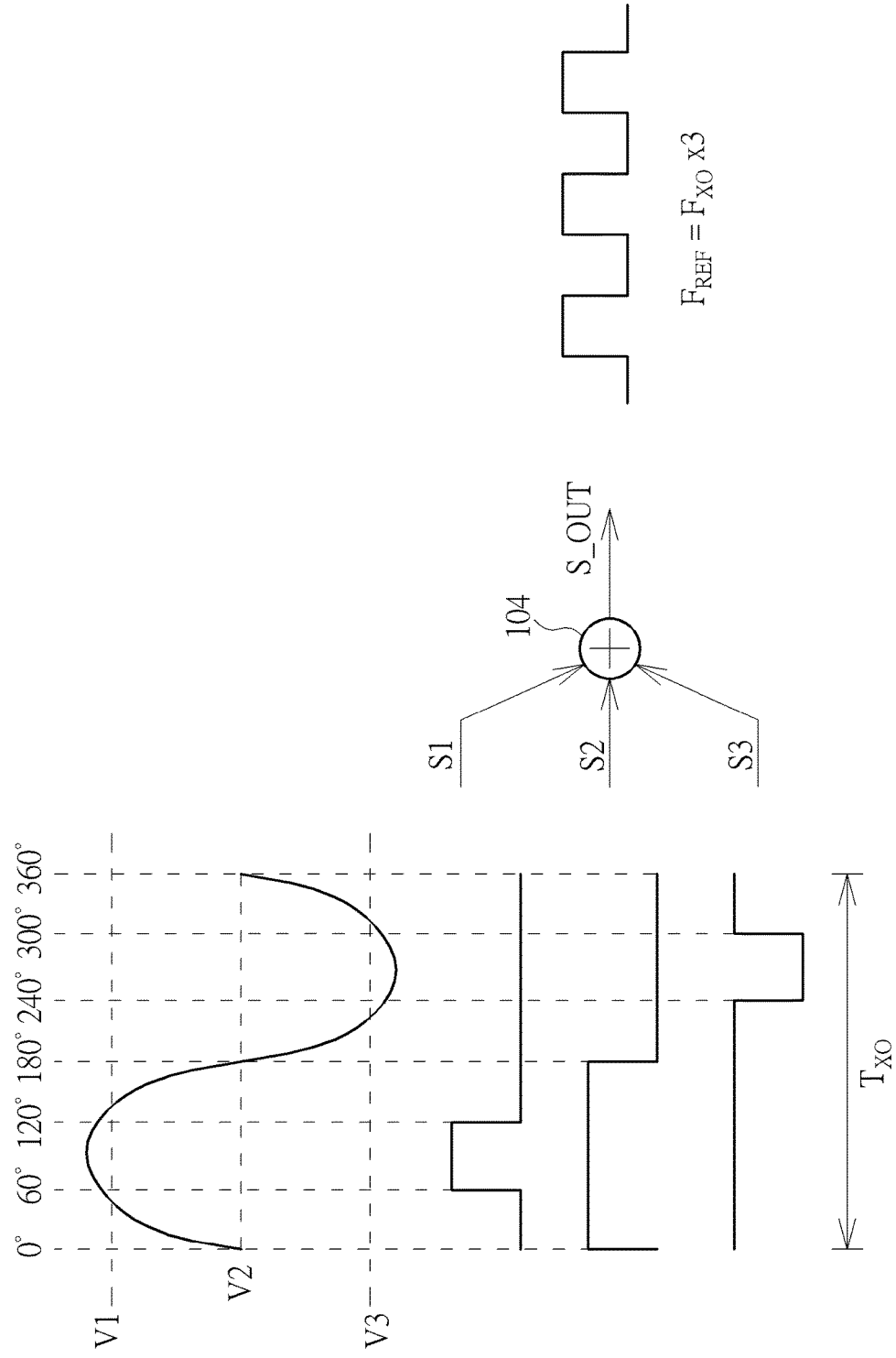
FIG. 5 is a diagram illustrating an edge combination example of generating an output signal with a frequency value that is three times as large as a frequency value of an oscillating signal.
Figure 7:
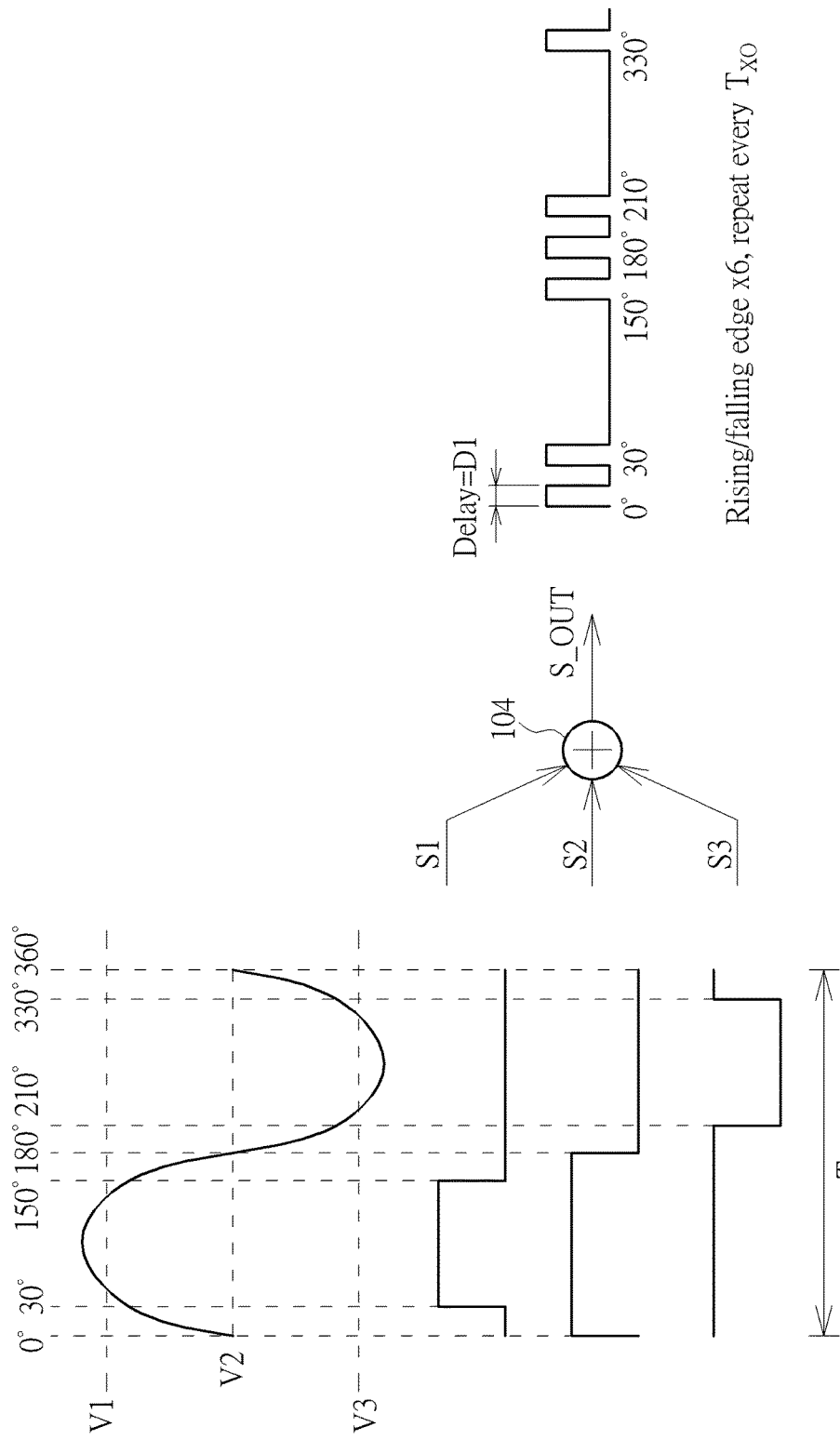
FIG. 7 is a diagram illustrating an edge combination example of generating an output signal with a frequency value that is six times as large as a frequency value of an oscillating signal.
Figure 9:
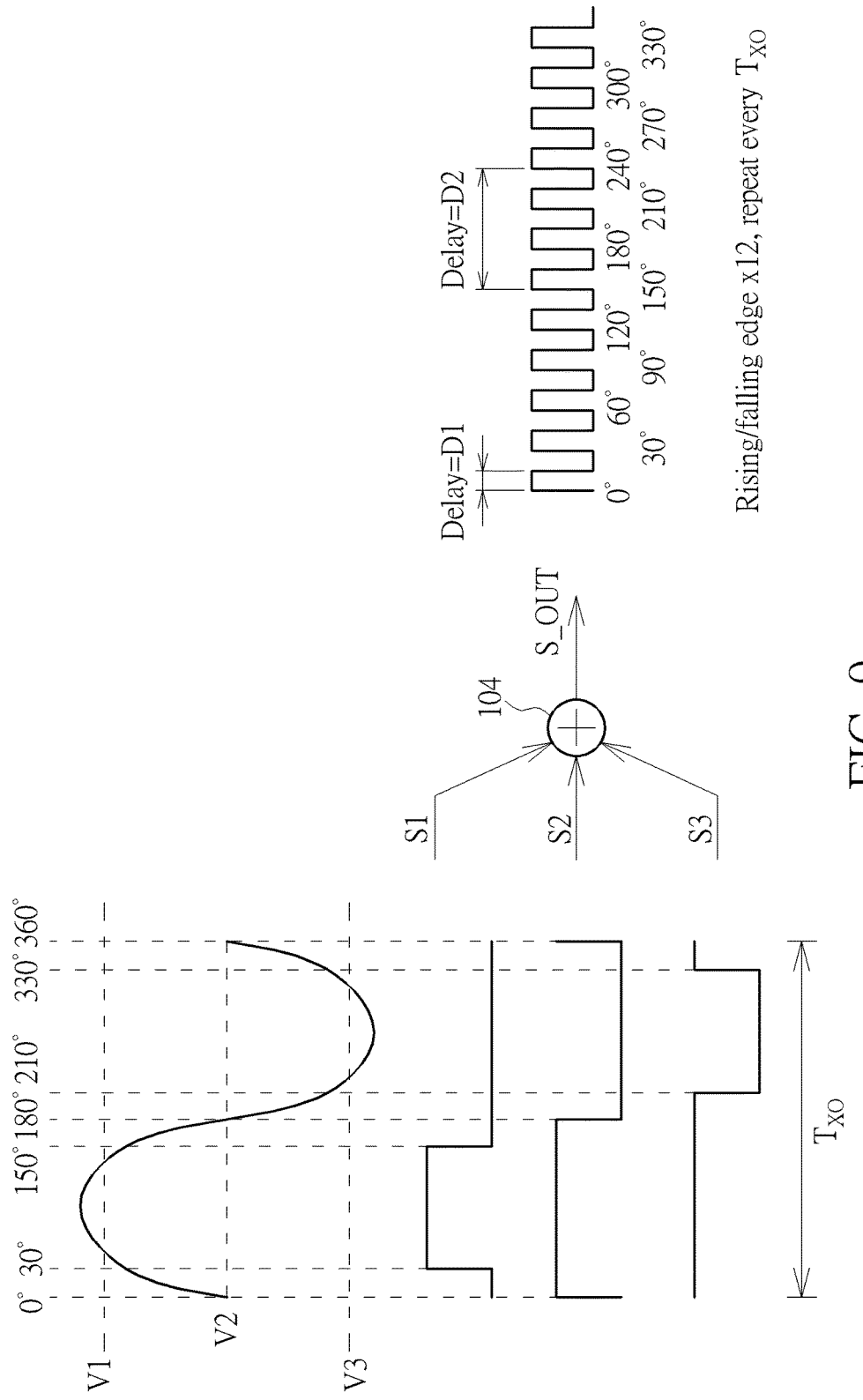
FIG. 9 is a diagram illustrating an edge combination example of generating an output signal with a frequency value that is twelve times as large as a frequency value of an oscillating signal.

The output signal S_OUT may have a uniform distribution of rising/falling edges or may have a non-uniform distribution of rising/falling edges, depending upon the actual edge sampling design of edge sampling circuits 102_1-102_N. For example, the output signal S_OUT with the uniform distribution of rising/falling edges may be generated when edge sampling is controlled to occur at uniformly distributed phases of the oscillating signal XO_IN, as illustrated in FIGS. 4 and 5. For another example, the output signal S_OUT with the non-uniform distribution of rising/falling edges may be generated when edge sampling is controlled to occur at non-uniformly distributed phases of the oscillating signal XO_IN, as illustrated in FIG. 7. For yet another example, the output signal S_OUT with the uniform distribution of rising/falling edges may be generated when edge sampling is controlled to occur at non-uniformly distributed phases of the oscillating signal XO_IN, as illustrated in FIG. 9. Further details of these exemplary edge sampling designs of edge sampling circuits 102_1-102_N will be described later.

Figure 2:
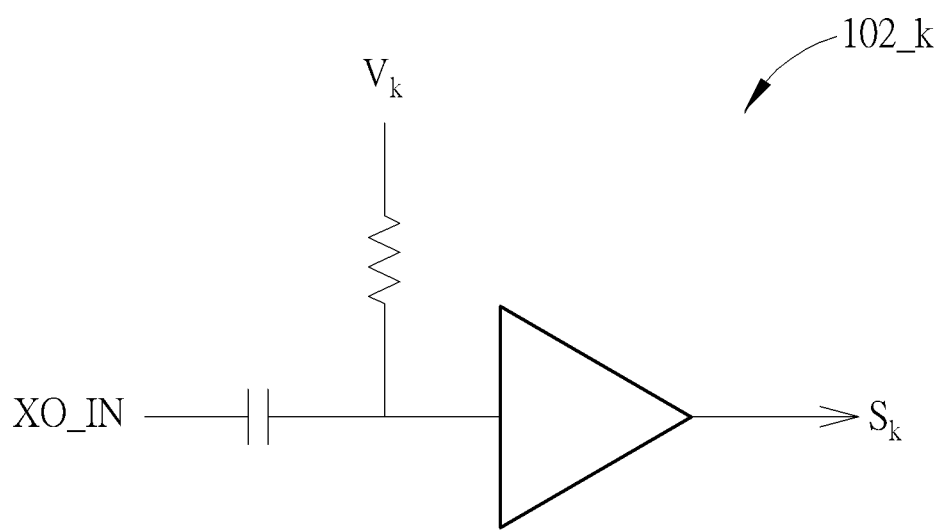
FIG. 2 is a diagram illustrating one edge sampling circuit according to an embodiment of the present invention.

FIG. 2 is a diagram illustrating one edge sampling circuit according to an embodiment of the present invention. For example, the edge sampling circuit 102_k shown in FIG. 2 may be any of the edge sampling circuits 102_1-102_N shown in FIG. 1, the voltage $V_k$ may be any of the voltages V1-VN shown in FIG. 1, and the sampled signal $S_k$ may be any of the sampled signals S1-SN shown in FIG. 1, where 1≤k≤N. In this embodiment, the edge sampling circuit 102_k is an AC-coupled buffer configured to receive the oscillating signal XO_IN and the voltage $V_k$ (which serves as a bias voltage) and then output a sampled signal $S_k$.

Figure 3:
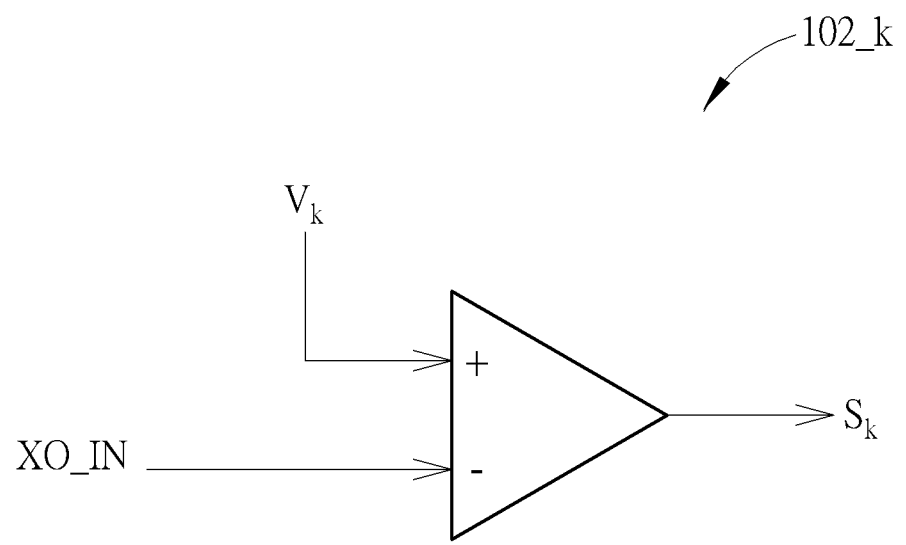
FIG. 3 is a diagram illustrating another edge sampling circuit according to an embodiment of the present invention.

FIG. 3 is a diagram illustrating another edge sampling circuit according to an embodiment of the present invention. For example, the edge sampling circuit 102_k shown in FIG. 3 may be any of the edge sampling circuits 102_1-102_N shown in FIG. 1, and the voltage $V_k$ may be any of the voltages V1-VN shown in FIG. 1, and the sampled signal $S_k$ may be any of the sampled signals S1-SN shown in FIG. 1, where 1≤k≤N. In this embodiment, the edge sampling circuit 102_k is a comparator (or a slicer) configured to compare (or slice) the oscillating signal XO_IN with the voltage $V_k$ (which serves as a reference voltage) and then output a sampled signal $S_k$.

It should be noted that the edge sampling circuit designs shown in FIG. 2 and FIG. 3 are for illustrative purposes only, and are not meant to be limitations of the present invention. In practice, any edge sampling design that is capable of sampling the waveform of the oscillating signal XO_IN to obtain a set of a rising edge and a falling edge can be employed. For example, in contrast to implementing the edge sampling circuits 102_1-102_N by AC-coupled buffers shown in FIG. 2, the edge sampling circuits 102_1-102_N may be implemented by buffers having different level transition threshold voltage settings. For another example, an inverter may be added to an output of the AC-coupled buffer shown in FIG. 2 (or a buffer with a designated level transition threshold voltage setting), or may be added to an input of the AC-coupled buffer shown in FIG. 2 (or a buffer with a designated level transition threshold voltage setting), depending upon the actual design considerations. For yet another example, the comparator shown in FIG. 3 may be implemented by an inverter, where an output of the inverter (i.e., sampled signal $S_k$) is determined by an input of the inverter (i.e., oscillating signal XO_IN) and a designated level transition threshold voltage setting of the inverter. These alternative designs also fall within the scope of the present invention.

In a case where the edge sampling circuits 102_1-102_N are implemented using AC-coupled buffers shown in FIG. 2 or comparators shown in FIG. 3, different voltages $V_k$ (e.g., different bias voltages or different reference voltages) are supplied to the edge sampling circuits 102_k, and different sampled signals $S_k$ are generated from the edge sampling circuits 102_k, where k=1, . . . , N. The edge combining circuit 104 is configured to combine the different sampled signals S1-SN generated from the edge sampling circuits 102_1-102_N, respectively, to generate the output signal S_OUT. In this embodiment, a frequency value $F_{REF}$ of the output signal S_OUT is higher than a frequency value $F_{XO}$ of the oscillating signal XO_IN. For example, the frequency value $F_{REF}$ of the output signal S_OUT is an integer multiple of the frequency value $F_{XO}$ of the oscillating signal XO_IN. That is, $F_{REF}=F_{XO}*A$, where A is a positive integer larger than 1. In a case where the output signal S_OUT has a uniform distribution of rising/falling edges, the value of A depends on the number of rising/falling edges uniformly distributed within one cycle of the oscillating signal XO_IN. In another case where the output signal S_OUT has a non-uniform distribution of rising/falling edges, the value of A depends on the number of rising/falling edges non-uniformly distributed within one cycle of the oscillating signal XO_IN.

FIG. 4 is a diagram illustrating an edge combination example of generating an output signal with a frequency value that is two times as large as a frequency value of an oscillating signal. Suppose that the crystal multi-sampling circuit 101 is configured to have two edge sampling circuits (N=2), and two different voltages V1 and V2 are supplied to the two edge sampling circuits, respectively. A first edge sampling circuit samples the waveform of the oscillating signal XO_IN at different phases 45° and 135° in one cycle $T_{XO}$ of the oscillating signal XO_IN according to the voltage V1, and generates a sampled signal S1 that has a rising edge sampled at 45° and a falling edge sampled at 135°. A second edge sampling circuit samples the waveform of the oscillating signal XO_IN at different phases 225° and 315° in the same cycle $T_{XO}$ of the oscillating signal XO_IN, and generates a sampled signal S2 that has a rising edge sampled at 225° and a falling edge sampled at 315°. Hence, edge sampling is controlled to occur at uniformly distributed phases 45°, 135°, 225°, 315° of the oscillating signal XO_IN. In this example, the edge combining circuit 104 may be implemented using an OR gate for performing an OR logic operation upon the sampled signals S1 and S2 to generate the output signal S_OUT that has two rising edges and two falling edges within a period corresponding to one cycle $T_{XO}$ of the oscillating signal XO_IN. Hence, the output signal S_OUT has a frequency value $F_{REF}$ that is two times as large as a frequency value $F_{XO}$ of the oscillating signal XO_IN.

Figure 6:
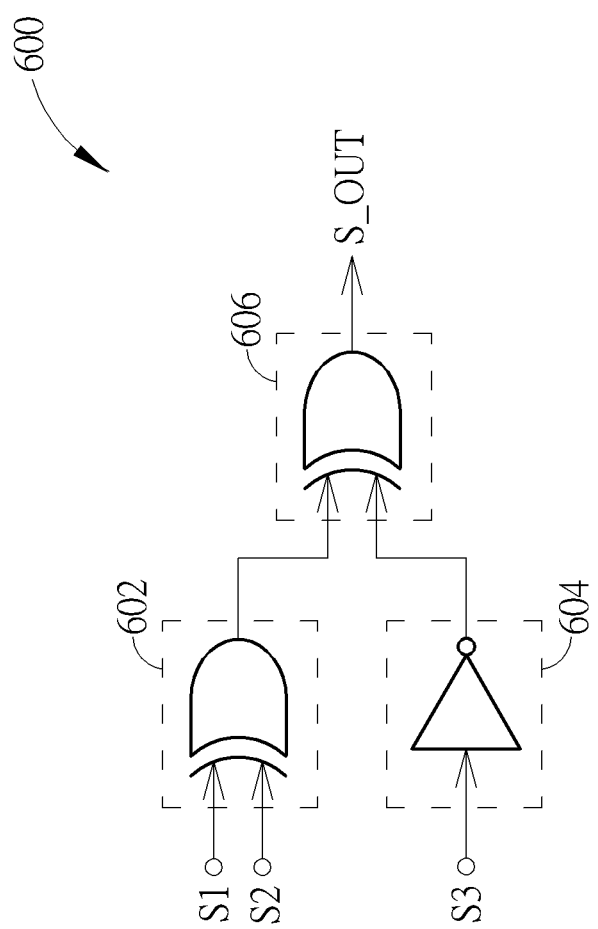
FIG. 6 is a diagram illustrating an edge combining circuit that may be used to realize an edge combining circuit shown in FIG. 5.

Please refer to FIG. 5 in conjunction with FIG. 6. FIG. 5 is a diagram illustrating an edge combination example of generating an output signal with a frequency value that is three times as large as a frequency value of an oscillating signal. FIG. 6 is a diagram illustrating an edge combining circuit that may be used to realize an edge combining circuit shown in FIG. 5. Suppose that the crystal multi-sampling circuit 101 is configured to have three edge sampling circuits (N=3), and three different voltages V1, V2 and V3 are supplied to the three edge sampling circuits, respectively. A first edge sampling circuit samples the waveform of the oscillating signal XO_IN at different phases 60° and 120° in one cycle $T_{XO}$ of the oscillating signal XO_IN according to the voltage V1, and generates a sampled signal S1 that has a rising edge sampled at 60° and a falling edge sampled at 120°. A second edge sampling circuit samples the waveform of the oscillating signal XO_IN at different phases 0° and 180° in the same cycle $T_{XO}$ of the oscillating signal XO_IN, and generates a sampled signal S2 that has a rising edge sampled at 0° and a falling edge sampled at 180°. The third edge sampling circuit samples the waveform of the oscillating signal XO_IN at different phases 240° and 300° in the same cycle $T_{XO}$ of the oscillating signal XO_IN, and generates a sampled signal S3 that has a falling edge sampled at 240° and a rising edge sampled at 300°. Hence, edge sampling is controlled to occur at uniformly distributed phases 0°, 60°, 120°, 180°, 240°, 300° of the oscillating signal XO_IN.

In this example, the edge combining circuit 104 may be implemented using the edge combining circuit 600 shown in FIG. 6. The edge combining circuit 600 includes a plurality of XOR gates 602 and 606 and an inverter 604. The XOR gate 602 performs an XOR logic operation upon the sampled signals S1 and S2. The inverter 604 is a NOT gate that performs a NOT logic operation upon the sampled signal S3. The XOR gate 606 performs an XOR logic operation upon signal outputs of the inverter 604 and the XOR gate 602 to generate the output signal S_OUT. As shown in FIG. 5, the output signal S_OUT derived from combining the sampled signals S1-S3 has three rising edges and three falling edges within a period corresponding to one cycle $T_{XO}$ of the oscillating signal XO_IN. Hence, the output signal S_OUT has a frequency value $F_{REF}$ that is three times as large as a frequency value $F_{XO}$ of the oscillating signal XO_IN.

It should be noted that the edge combining circuit designs illustrated in FIG. 4 and FIG. 6 are for illustrative purposes only, and are not meant to be limitations of the present invention. For example, when at least one of the sampled signals S1 and S2 has a waveform different from that shown in FIG. 4, the edge combining circuit 104 may be implemented by an adequate logic circuit that is capable of generating the same output signal S_OUT shown in FIG. 4. For another example, when at least one of the sampled signals S1-S3 has a waveform different from that shown in FIG. 5, the edge combining circuit 104 may be implemented by an adequate logic circuit that is capable of generating the same output signal S_OUT shown in FIG. 5. These alternative designs also fall within the scope of the present invention.

The proposed signal generator can exploit rising edge(s) and falling edge(s) from an oscillating signal (e.g., a sinusoidal wave generated from a crystal oscillator) to generate an output signal (e.g., a square wave) with a higher frequency value that can effectively reduce the in-band noise. For example, the output signal with $F_{REF}=F_{XO}*2$ may reduce in-band noise by +3 dB, ideally; and the output signal with $F_{REF}=F_{XO}*4$ may reduce in-band noise by +6 dB, ideally. However, zero-crossing points at phases 0°/360° and 180° of the waveform of the oscillating signal XO_IN are best sampling points due to largest slopes. Taking samples at phases away from 0°/360° and 180° may lead to noise performance degradation. For example, performing sampling at 45°/135°/225°/315° may lead to noise performance degradation $10*\log(\cos(45°)^2)=-3$ dB. To mitigate the undesired noise performance degradation, the present invention further proposes taking samples at phases closer to 0°/360° and 180°. For example, each of the edge sampling circuits 102_1-102_N is configured to sample the waveform of the oscillating signal XO_IN at different phases in one cycle of the oscillating signal XO_IN, where each of the different phases is closer to 0° or 180° than 90° when being within a range from 0° to 180°, and is closer to 180° or 360° than 270° when being within a range from 180° to 360°. In a case where the edge sampling circuits 102_1-102_N are implemented using AC-coupled buffers shown in FIG. 2 or comparators shown in FIG. 3, the sampling points can be properly controlled by setting the voltages (e.g., bias voltages or reference voltages) V1-VN supplied to the edge sampling circuits 102_1-102_N.

Figure 8:
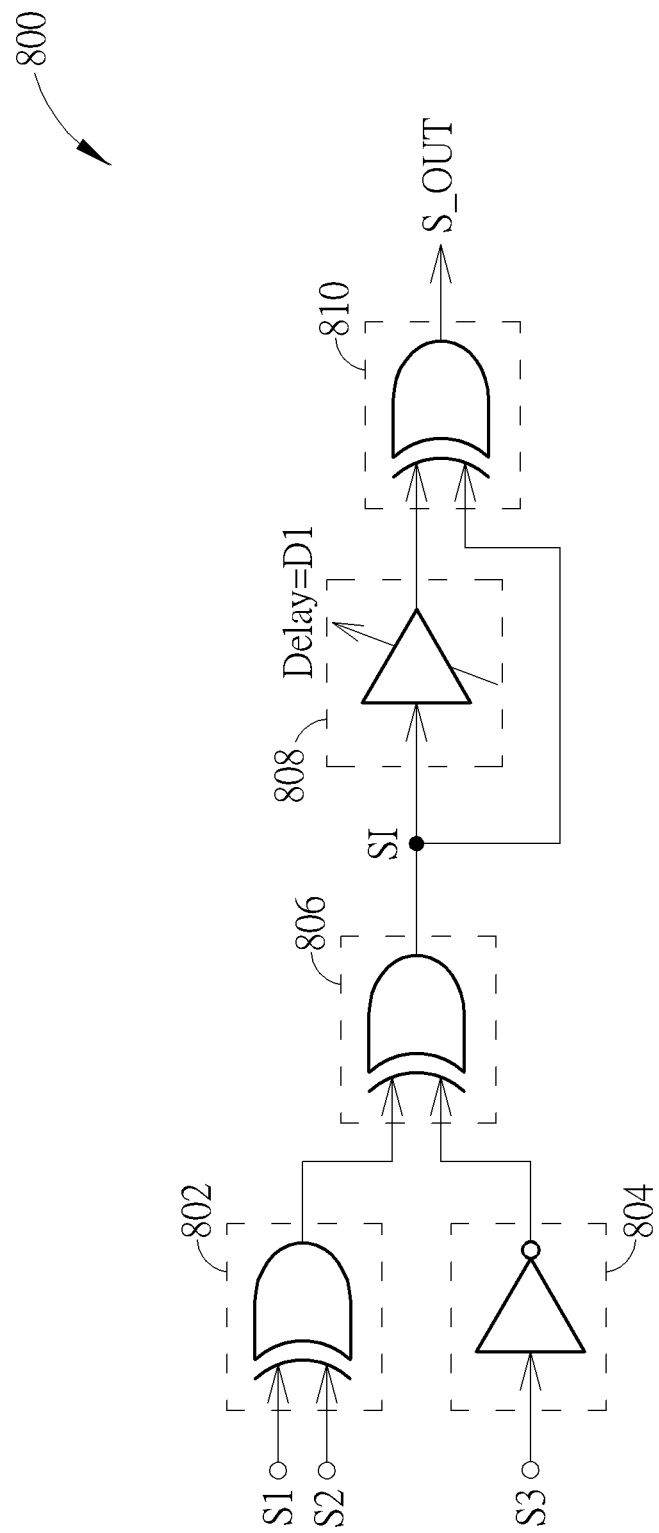
FIG. 8 is a diagram illustrating an edge combining circuit that may be used to realize an edge combining circuit shown in FIG. 7.

Please refer to FIG. 7 in conjunction with FIG. 8. FIG. 7 is a diagram illustrating an edge combination example of generating an output signal with a frequency value that is six times as large as a frequency value of an oscillating signal. FIG. 8 is a diagram illustrating an edge combining circuit that may be used to realize an edge combining circuit shown in FIG. 7. Suppose that the crystal multi-sampling circuit 101 is configured to have three edge sampling circuits (N=3), and three different voltages V1, V2 and V3 are supplied to the three edge sampling circuits, respectively. A first edge sampling circuit samples the waveform of the oscillating signal XO_IN at different phases 30° and 150° in one cycle $T_{XO}$ of the oscillating signal XO_IN according to the voltage V1, and generates a sampled signal S1 that has a rising edge sampled at 30° and a falling edge sampled at 150°. A second edge sampling circuit samples the waveform of the oscillating signal XO_IN at different phases 0° and 180° in the same cycle $T_{XO}$ of the oscillating signal XO_IN, and generates a sampled signal S2 that has a rising edge sampled at 0° and a falling edge sampled at 180°. A third edge sampling circuit samples the waveform of the oscillating signal XO_IN at different phases 210° and 330° in the same cycle $T_{XO}$ of the oscillating signal XO_IN, and generates a sampled signal S3 that has a falling edge sampled at 210° and a rising edge sampled at 330°. Hence, edge sampling is controlled to occur at non-uniformly distributed phases 0°, 30°, 150°, 180°, 210°, 330° of the oscillating signal XO_IN.

In this example, the edge combining circuit 104 may be implemented using the edge combining circuit 800 shown in FIG. 8. The edge combining circuit 800 includes a plurality of XOR gates 802, 806, 810, an inverter 804, and a controllable delay buffer 808. The XOR gate 802 performs an XOR logic operation upon the sampled signals S1 and S2. The inverter 804 is a NOT gate that performs a NOT logic operation upon the sampled signal S3. The XOR gate 806 performs an XOR logic operation upon signal outputs of the inverter 804 and the XOR gate 802 to generate an intermediate signal SI. The controllable delay buffer 808 is programmed to apply a delay amount D1 to the intermediate signal SI. The XOR gate 810 performs an XOR logic operation upon a delayed version of the intermediate signal SI and an original version of the intermediate signal SI to generate the output signal S_OUT. As shown in FIG. 7, the output signal S_OUT derived from combining the sampled signals S1-S3 has a non-uniform distribution of six rising edges and sixth falling edges within a period corresponding to one cycle $T_{XO}$ of the oscillating signal XO_IN. Hence, the output signal S_OUT may be regarded as a non-uniform clock signal having a frequency value $F_{REF}$ that is six times as large as a frequency value $F_{XO}$ of the oscillating signal XO_IN.

With regard to an application that can operate according to an output signal with a non-uniform distribution of rising edges and falling edges, the exemplary edge combining circuit design shown in FIG. 8 may be employed to realize the edge combining circuit 104 shown in FIG. 7. However, with regard to an application that requires an output signal with a uniform distribution of rising edges and falling edges, the edge combining circuit 104 shown in FIG. 7 may be modified to employ an adequate logic circuit design for generating the required output signal.

Figure 10:
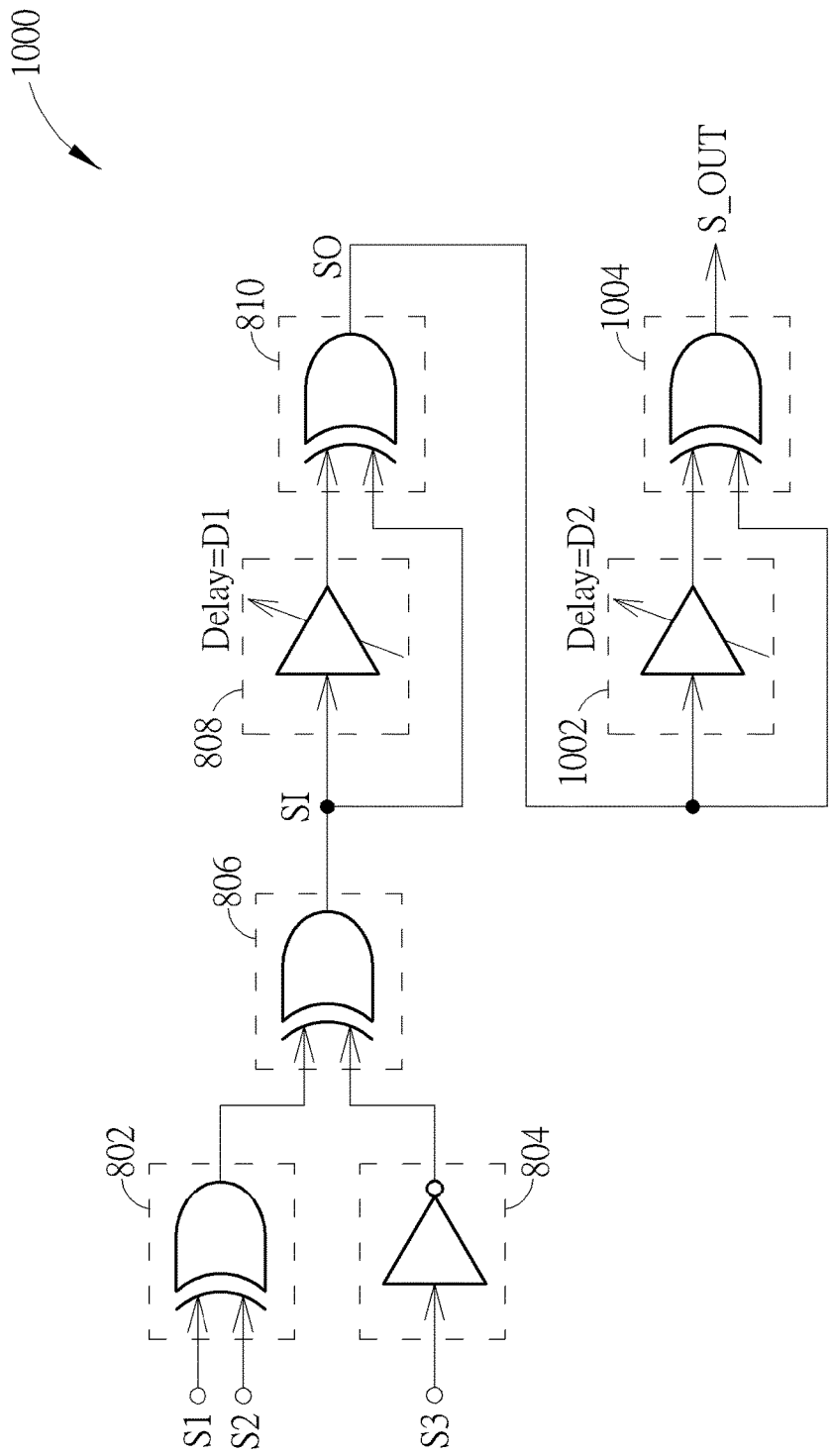
FIG. 10 is a diagram illustrating an edge combining circuit that may be used to realize an edge combining circuit shown in FIG. 9.

Please refer to FIG. 9 in conjunction with FIG. 10. FIG. 9 is a diagram illustrating an edge combination example of generating an output signal with a frequency value that is twelve times as large as a frequency value of an oscillating signal. FIG. 10 is a diagram illustrating an edge combining circuit that may be used to realize an edge combining circuit shown in FIG. 9. As mentioned above, the sampled signal S1 has a rising edge sampled at 30° and a falling edge sampled at 150°. The sampled signal S2 has a rising edge sampled at 0° and a falling edge sampled at 180°. The sampled signal S3 has a falling edge sampled at 210° and a rising edge sampled at 330°. Hence, edge sampling is controlled to occur at non-uniformly distributed phases 0°, 30°, 150°, 180°, 210°, 330° of the oscillating signal XO_IN. In this example, the edge combining circuit 104 may be implemented using the edge combining circuit 1000 shown in FIG. 10. The major difference between the edge combining circuits 800 and 1000 is that the edge combining circuit 1000 further includes a controllable delay buffer 1002 and an XOR gate 1004. Another intermediate signal SO (which is a signal output of the XOR gate 810) is fed into both of the controllable delay buffer 1002 and the XOR gate 1004. The controllable delay buffer 1002 is programmed to apply a delay amount D2 to the intermediate signal SO. The XOR gate 810 performs an XOR logic operation upon a delayed version of the intermediate signal SO and an original version of the intermediate signal SO to generate the output signal S_OUT. As shown in FIG. 9, the output signal S_OUT derived from combining the sampled signals S1-S3 has a uniform distribution of twelve rising edges and twelve falling edges within a period corresponding to one cycle $T_{XO}$ of the oscillating signal XO_IN. Hence, the output signal S_OUT has a frequency value $F_{REF}$ that is twelve times as large as a frequency value $F_{XO}$ of the oscillating signal XO_IN.

It should be noted that the edge combining circuit designs illustrated in FIG. 8 and FIG. 10 are for illustrative purposes only, and are not meant to be limitations of the present invention. For example, when at least one of the sampled signals S1-S3 has a waveform different from that shown in FIG. 7, the edge combining circuit 104 may be implemented by an adequate logic circuit that is capable of generating the same output signal S_OUT shown in FIG. 7. For another example, when at least one of the sampled signals S1-S3 has a waveform different from that shown in FIG. 9, the edge combining circuit 104 may be implemented by an adequate logic circuit that is capable of generating the same output signal S_OUT shown in FIG. 9. These alternative designs also fall within the scope of the present invention.

Figure 11:
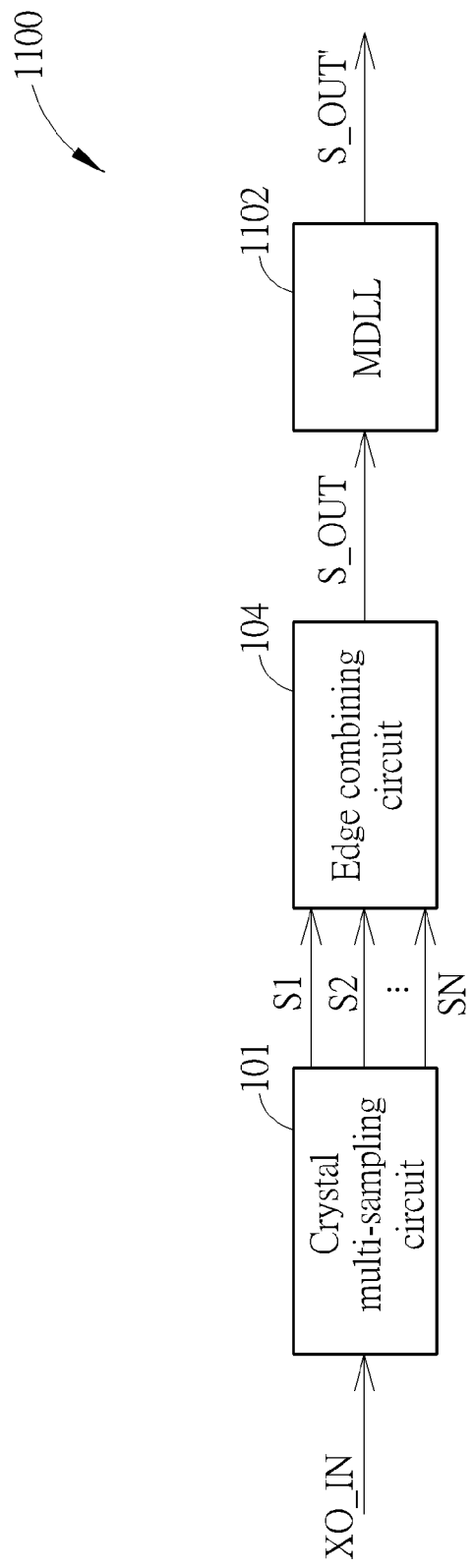
FIG. 11 is a block diagram illustrating a second signal generator according to an embodiment of the present invention.

With regard to an application that requires an output signal with a uniform distribution of rising edges and falling edges, a refinement circuit may be added for processing the output signal S_OUT generated by the edge combining circuit 104 in FIG. 7 to rebuild an output signal with a uniform distribution of rising edges and falling edges. FIG. 11 is a block diagram illustrating a second signal generator according to an embodiment of the present invention. The signal generator 1100 receives an oscillating signal XO_IN from a clock source (e.g., crystal oscillator 10 shown in FIG. 1), and processes the oscillating signal XO_IN to supply a refined output signal S_OUT' to a following processing circuit such as a phase-locked loop (PLL). In this embodiment, the crystal multi-sampling circuit 101 generates multiple sampled signals S1-SN (e.g., sampled signals S1-S3 shown in FIG. 7) to the edge combining circuit 104, and the edge combining circuit 104 combines the sampled signals S1-SN (e.g., sampled signals S1-S3 shown in FIG. 7) to generate an output signal S_OUT with a non-uniform distribution of rising edges and falling edges (e.g., output signal S_OUT shown in FIG. 7). In this embodiment, a multiplying delay-locked loop (MDLL) 1102 is used to serve as a refinement circuit for generating a refined output signal S_OUT' (which has a uniform distribution of rising edges and falling edges) according to the output signal S_OUT (which has a non-uniform distribution of rising edges and falling edges).

Figure 12:
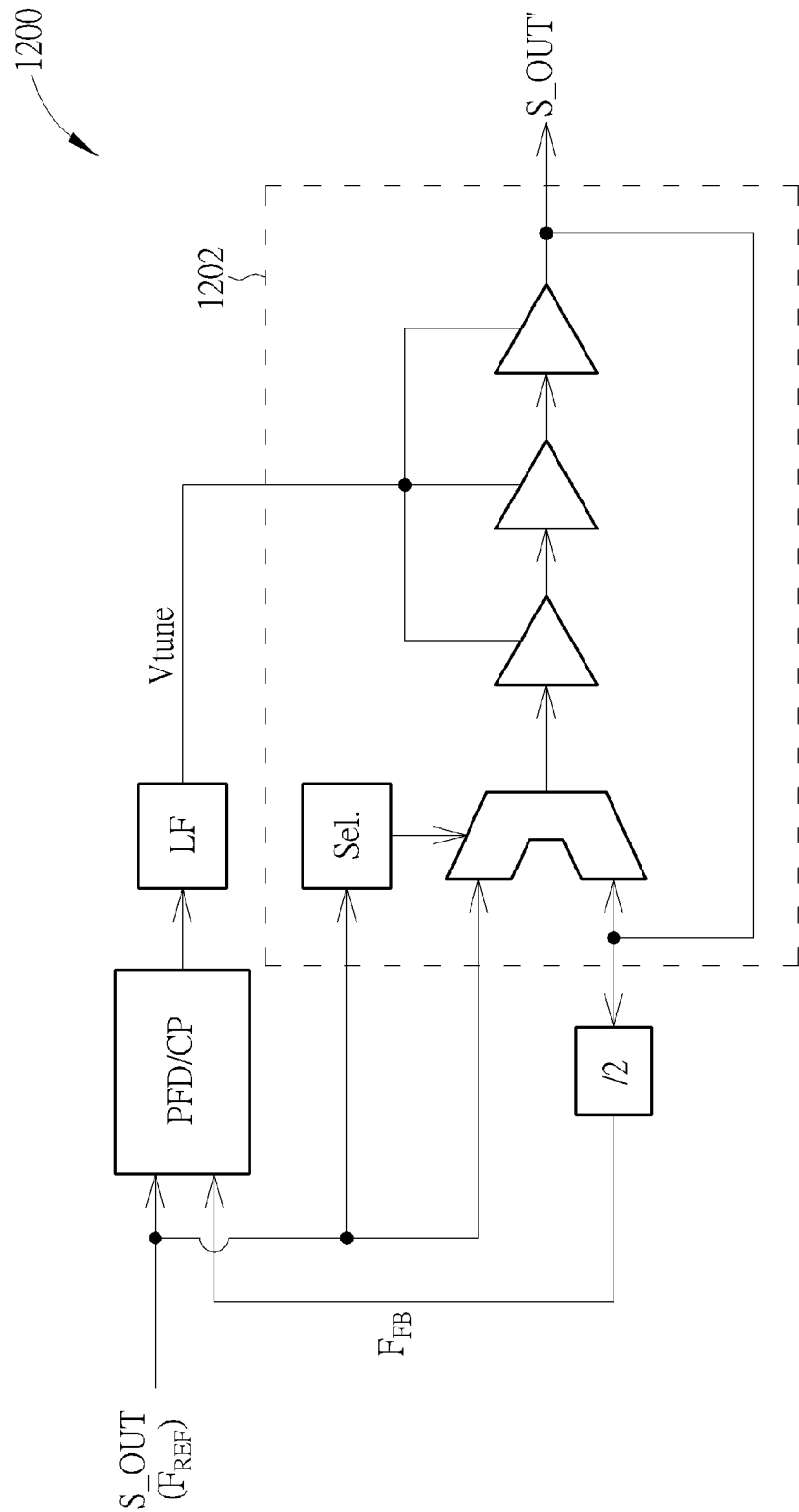
FIG. 12 is a diagram illustrating an MDLL according to an embodiment of the present invention.

FIG. 12 is a diagram illustrating an MDLL according to an embodiment of the present invention. The MDLL 1102 shown in FIG. 11 may be implemented using the MDLL 1200 shown in FIG. 12. The MDLL 1200 has a re-alignment voltage-controlled oscillator (VCO) 1202. The phase frequency detector (PFD) and charge pump (CP)) are used to generate a result of comparing the output signal S_OUT with a frequency value $F_{REF}$ and a feedback signal with a frequency value $F_{FB}$ to a loop filter (LP), where the feedback signal is generated by a frequency divider (denoted by "/2") according to the refined output signal S_OUT'. A tuning voltage $V_{tune}$ is generated from the loop filter to a delay line in the re-alignment VCO 1202. An input of the delay line is set by a multiplexer controlled by a selection signal generated from a selector (denoted by "Sel."). Hence, the input of the delay line is obtained from one of the output signal S_OUT and the refined output signal S_OUT'. When the output signal S_OUT fed into the MDLL 1200 has the waveform shown in FIG. 7, the refined output signal S_OUT' generated from the MDLL 1200 can have the waveform shown in FIG. 9. Since a person skilled in the art should readily understand the principle of the MDLL 1200 shown in FIG. 12, further description is omitted here for brevity.

As mentioned above, when the edge sampling circuits 102_1-102_N are implemented using AC-coupled buffers shown in FIG. 2 or comparators shown in FIG. 3, the sampling points can be properly controlled by setting the voltages (e.g., bias voltages or reference voltages) V1-VN supplied to the edge sampling circuits 102_1-102_N. To ensure that the voltages (e.g., bias voltages or reference voltages) V1-VN are correctly set by the desired voltage values, the proposed signal generator may be further configured to include a calibration mechanism for automatic bias voltage calibration (or automatic reference voltage calibration).

Figure 13:
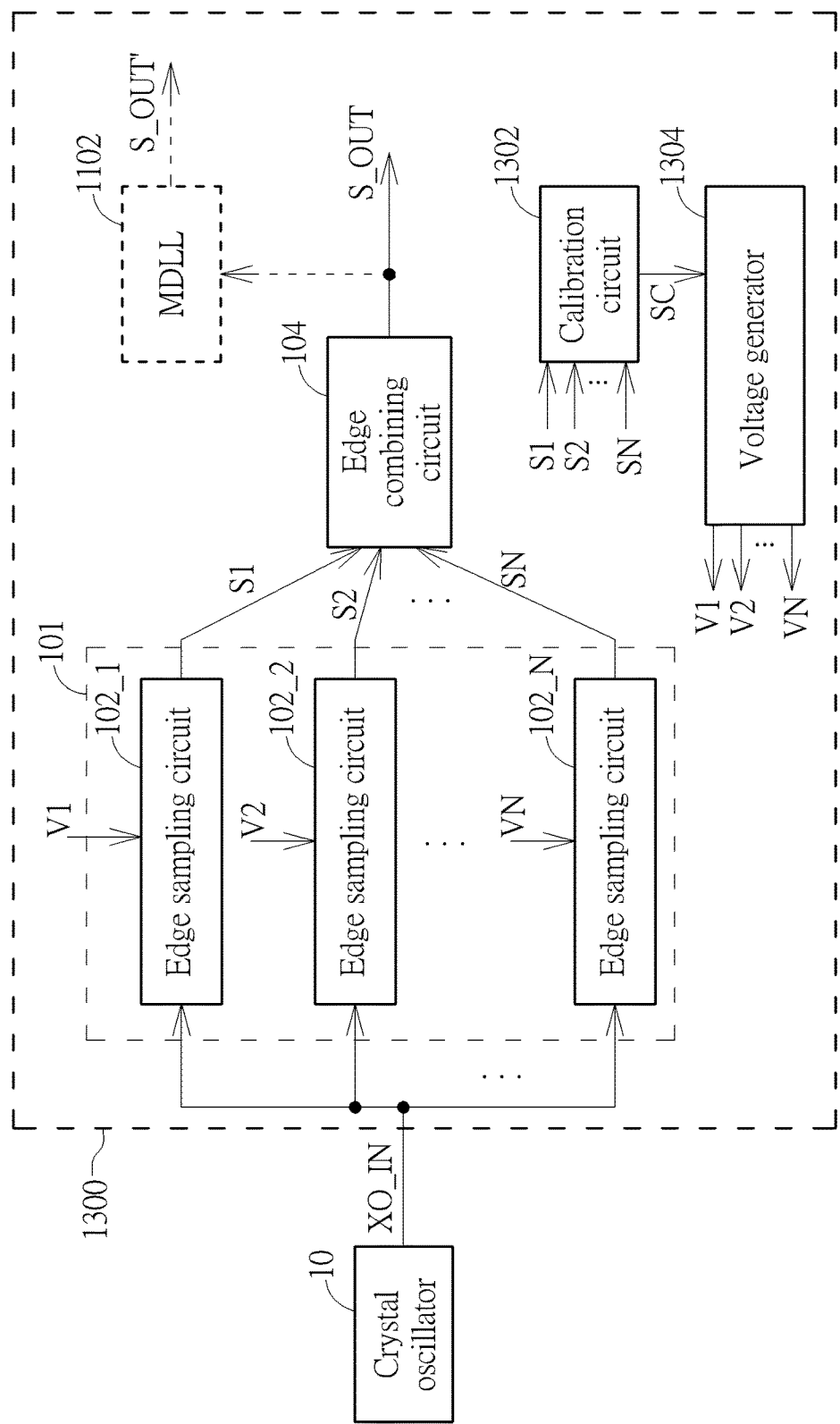
FIG. 13 is a block diagram illustrating a third signal generator according to an embodiment of the present invention.

FIG. 13 is a block diagram illustrating a third signal generator according to an embodiment of the present invention. The signal generator 1300 receives an oscillating signal XO_IN from a clock source (e.g., crystal oscillator 10), and processes the oscillating signal XO_IN to supply an output signal S_OUT (or a refined output signal S_OUT') to a following processing circuit (e.g., PLL). In this embodiment, the crystal multi-sampling circuit 101 generates multiple sampled signals S1-SN (e.g., sampled signals S1-S3 shown in FIG. 7) to the edge combining circuit 104, and the edge combining circuit 104 combines the sampled signals S1-SN to generate the output signal S_OUT. If the output signal S_OUT generated from the edge combining circuit 104 has a non-uniform distribution of rising edges and falling edges, the output signal S_OUT may be directly supplied to an application that can operate according to the output signal S_OUT, or may be processed by the MDLL 1102 to generate the refined output signal S_OUT' to an application that requires an output signal with a uniform distribution of rising edges and falling edges.

Figure 14:
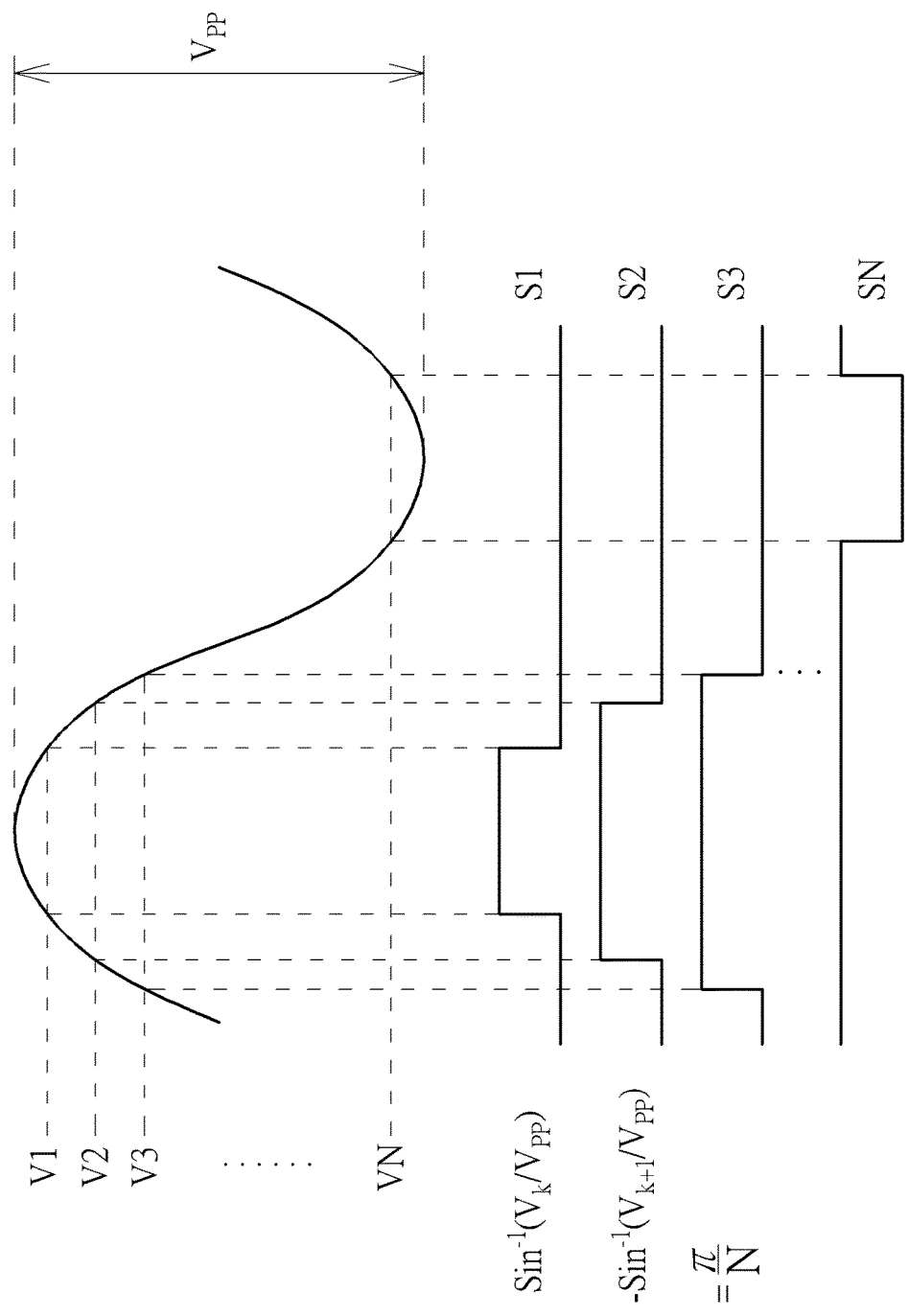
FIG. 14 is a diagram illustrating different sampled signals generated from the crystal multi-sampling circuit 101 shown in FIG. 13 according to an embodiment of the present invention.

In this embodiment, the signal generator 1300 further includes a calibration circuit 1302 and a voltage generator 1304. The voltage generator 1304 is controllable and is configured to generate different voltages (e.g., different bias voltages or different reference voltages) V1-VN to the edge sampling circuits 102_1-102_N, where N is a positive integer larger than one (i.e., N≥2). Since the voltages V1-VN are different from one another, the edge sampling circuits 102_1-102_N perform sampling upon the waveform of the same oscillating signal XO_IN to obtain different rising edges and falling edges and output different sampled signals S1-SN. FIG. 14 is a diagram illustrating different sampled signals generated from the crystal multi-sampling circuit 101 shown in FIG. 13 according to an embodiment of the present invention. By way of example, but not limitation, the voltages V1-VN may be set by voltage values in a descending order, and may satisfy the following equation:

$$\mathrm{Sin}^{-1}\left(\frac{V_k}{V_{pp}}\right) - \mathrm{Sin}^{-1}\left(\frac{V_{k+1}}{V_{pp}}\right) = \frac{\pi}{N},$$

where $V_k$ and $V_{k+1}$ are successive voltage values in the descending order, and $V_{pp}$ is a peak-to-peak voltage value of the oscillating signal XO_IN.

Figure 15:
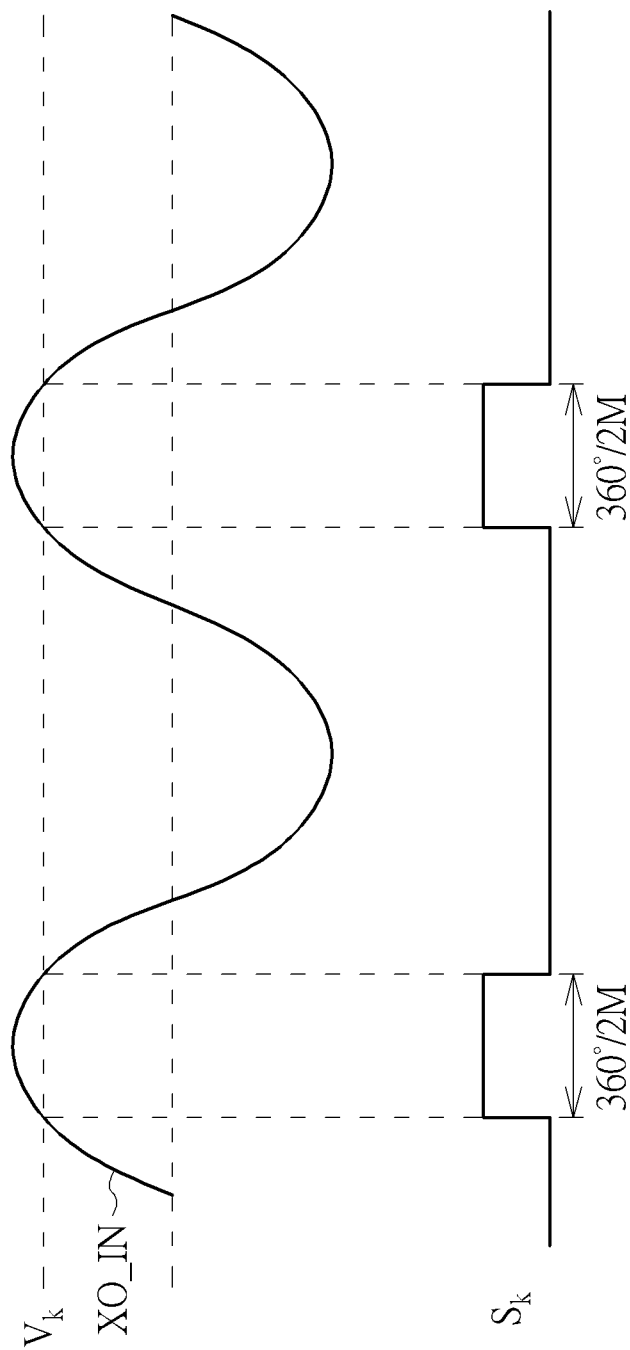
FIG. 15 is a diagram illustrating a sampled signal generated by an edge sampling circuit supplied with a voltage generated from the voltage generator 1304 shown in FIG. 13.

When a bias/reference voltage is correctly set by a desired voltage value, a sampled signal generated by an edge sampling circuit supplied with the bias/reference voltage includes a rising edge and a falling edge that are sampled at designated phases. FIG. 15 is a diagram illustrating a sampled signal generated by an edge sampling circuit supplied with a voltage generated from the voltage generator 1304 shown in FIG. 13. The voltage $V_k$ may be a bias voltage (or a reference voltage) generated from the voltage generator 1304 to an edge sampling circuit 102_k, where 1≤k≤N. Hence, the edge sampling circuit 102_k obtains a set of a rising edge and a falling edge in each cycle of the oscillating signal XO_IN according to the voltage $V_k$, and generates a sampled signal $S_k$ that includes the set of the sampled rising edge and falling edge with one period corresponding to each cycle of the oscillating signal XO_IN. As shown in FIG. 15, when the voltage $V_k$ is correctly set by a desired voltage value, the pulse width in each period of the sampled signal $S_k$ corresponds to $$\frac{360°}{2M}$$

exactly, where M is a positive integer. However, when the voltage $V_k$ deviates from the desired voltage value due to certain factors, the sampled signal $S_k$ includes a set of a rising edge and a falling edge that are sampled at incorrect phases. As a result, the pulse width in each period of the sampled signal $S_k$ is extended or shrank, and thus fails to exactly correspond to 360°/2M. The calibration circuit 1302 may monitor the sampled signals S1-SN to generate a control signal SC. The control signal SC is used to deliver calibration information associated with each of the voltages V1-VN. Hence, the voltage generator 1304 calibrates the voltages V1-VN in response to the control signal SC.

Figure 16:
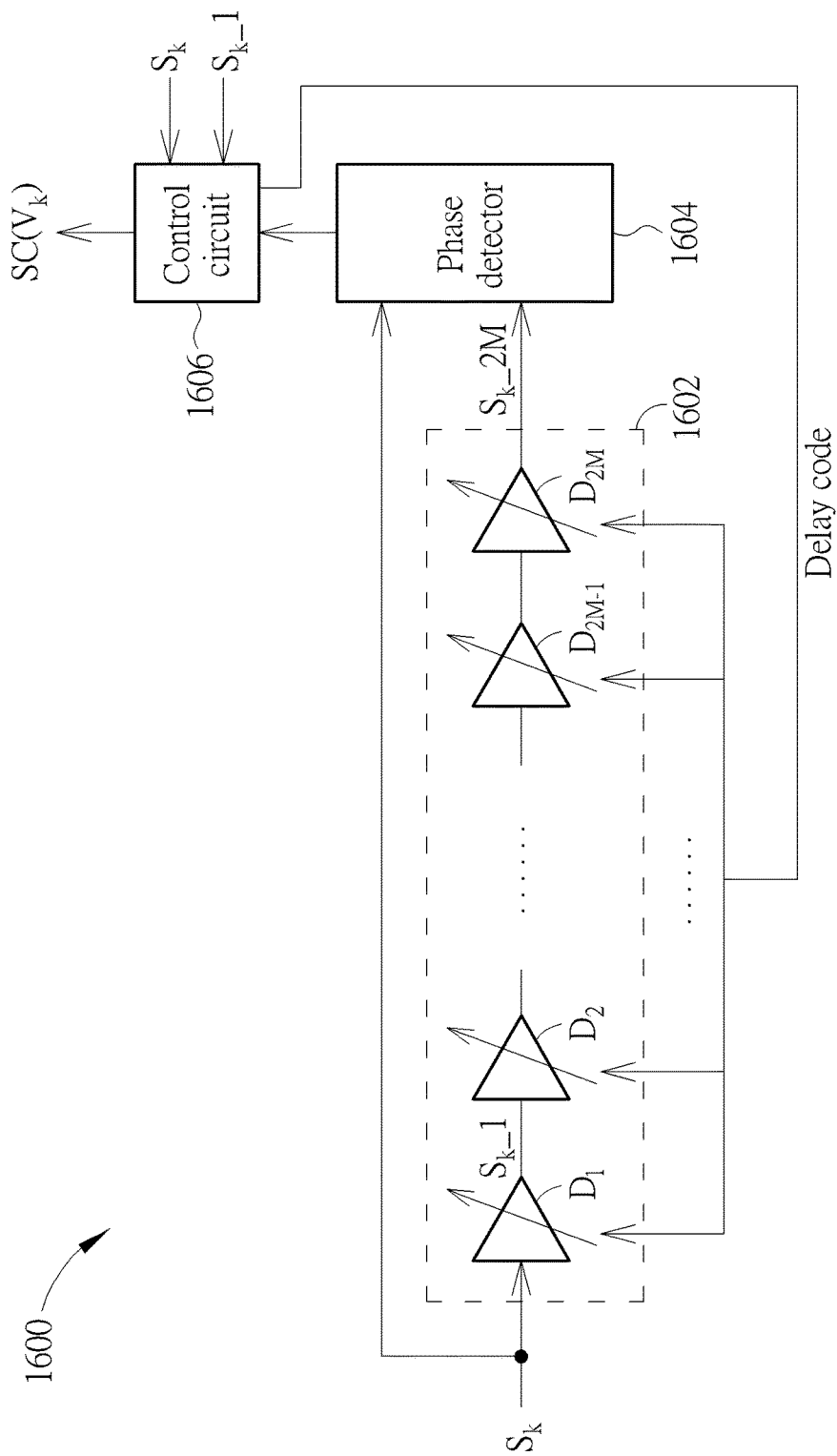
FIG. 16 is a diagram illustrating a calibration circuit according to an embodiment of the present invention.
Figure 17:
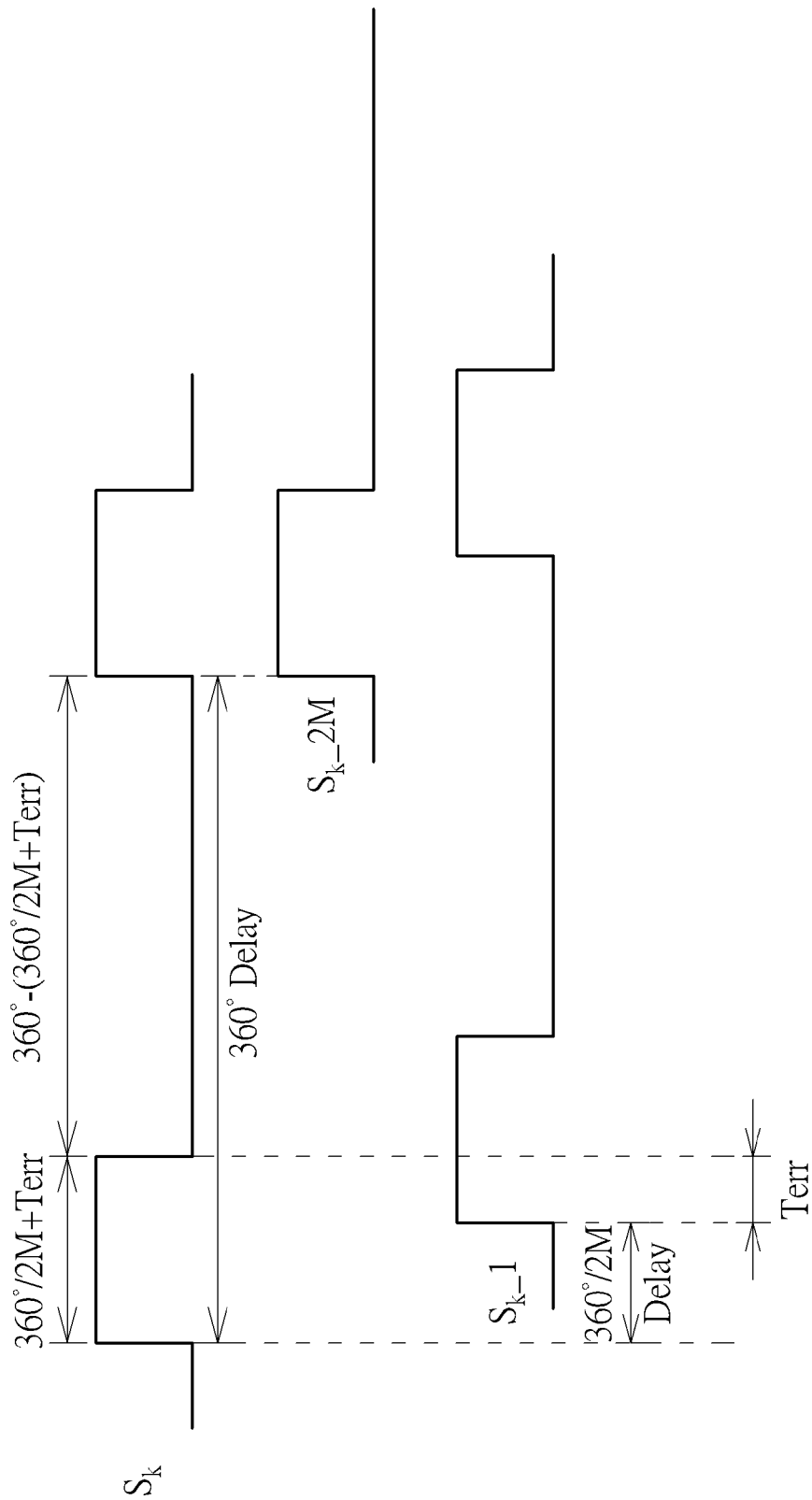
FIG. 17 is a diagram illustrating an exemplary voltage calibration operation performed by the calibration circuit shown in FIG. 16.

Please refer to FIG. 16 in conjunction with FIG. 17. FIG. 16 is a diagram illustrating a calibration circuit according to an embodiment of the present invention. FIG. 17 is a diagram illustrating an exemplary voltage calibration operation performed by the calibration circuit shown in FIG. 16. The calibration circuit 1302 shown in FIG. 13 may be configured to include the calibration circuit 1600 shown in FIG. 16 for performing voltage calibration upon one voltage supplied to an edge sampling circuit. In this embodiment, the calibration circuit 1600 includes a delay line 1602, a phase detector 1604 and a control circuit 1606. The delay line 1602 is composed of a plurality of controllable delay buffers $D_1, D_2, \ldots, D_{2M-1}, D_{2M}$, where M is a positive integer. The sampled signal $S_k$ generated by the voltage $V_k$ to be calibrated is fed into the delay line 1602 under a calibration mode. The sampled signal $S_k$ may be any of the sampled signals S1-SN generated from the crystal multi-sampling circuit 101. The delay amounts of the controllable delay buffers $D_1$-$D_{2M}$ in the delay line 1602 are programmed by a delay code generated from the control circuit 1606 for applying a 360° phase delay to the sampled signal $S_k$. The phase difference between the sampled signal $S_k$ and the delayed signal $S_k\_2 M$ is detected by the phase detector 1604 to indicate whether the 360° phase delay is correctly set by the delay line 1602. When the phase of delayed signal $S_k\_2 M$ is not aligned with the phase of the sampled signal $S_k$, it means the delay amounts of the controllable delay buffers $D_1$-$D_{2M}$ in the delay line 1602 do not apply the desired 360° phase delay to the sampled signal $S_k$. Hence, the control circuit 1606 adjusts the delay code according to the phase difference detected by the phase detector 1604. A closed-loop control is used to adaptively adjust the delay code according to an output of the phase detector 1604. The control circuit 1606 does not stop adjusting the delay code until the phase detector 1604 indicates that the phase of the delayed signal $S_{k\_2M}$ is aligned with the phase of the sampled signal $S_k$. Suppose that each of the controllable delay buffers $D_1$-$D_{2M}$ has the same delay amount programmed by the delay code. When the phase of delayed signal $S_{k\_2M}$ is aligned with the phase of the sampled signal $S_k$, the delay amount of each controllable delay buffer is equal to $$\frac{360°}{2M}.$$

Hence, the delay amount is set by a value equal to the pulse width in each period of the sampled signal $S_k$ generated under a condition that the voltage $V_k$ is correctly set by the desired voltage value.

When the voltage $V_k$ is correctly set by the desired voltage value, a first-type edge (e.g., a rising edge) of the delayed signal $S_{k\_1}$ should be aligned with a second-type edge (e.g., a falling edge) of the sampled signal $S_k$. As shown in FIG. 17, there is a timing error $T_{err}$ between the rising edge of the delayed signal $S_{k\_1}$ and the falling edge of the sampled signal $S_k$. The timing error $T_{err}$ reflects that the voltage $V_k$ deviates from the desired voltage value. The control circuit 1606 therefore refers to the timing error $T_{err}$ to estimate the voltage deviation, and generates a control signal SC ($V_k$) to the voltage generator 1304. Hence, the voltage generator 1304 is instructed by the control signal SC ($V_k$) to apply proper calibration to the voltage $V_k$.

In one exemplary design, an input of the calibration circuit 1600 shown in FIG. 16 may switch between multiple sampled signals having different waveforms but the same pulse width per period (e.g., the sampled signals S1 and S2 shown in FIG. 2), such that each of the voltages associated with generation of the multiple sampled signals can be calibrated using the same calibration circuit 1600. However, this is for illustrative purposes only, and is not meant to be a limitation of the present invention. Alternatively, the calibration circuit 1302 shown in FIG. 13 may be configured to have multiple calibration circuits 1600 shown in FIG. 16 for monitoring multiple sampled signals having different waveforms but the same pulse width per period (e.g., the sampled signals S1 and S2 shown in FIG. 2), respectively.

It should be noted that the number of controllable delay buffers implemented in the delay line 1602 depends on the desired pulse width $$\frac{360°}{2M}$$

associated with the voltage $V_k$. Hence, concerning a different voltage $V_{k+1}$ to be calibrated, another calibration circuit 1600 with a different number of controllable delay buffers implemented in the delay line 1602 is needed for voltage calibration. For example, in a case where the voltages V1-VN are associated with different pulse widths $$\frac{360°}{2M},$$

the calibration circuit 1302 shown in FIG. 13 may be configured to have a plurality of calibration circuits 1600 with different delay line configurations for performing voltage calibration upon the voltages V1-VN.

The output signal S_OUT generated from the edge combining circuit (or the refined output signal S_OUT generated from the MDLL) may be used by a frequency synthesizer such as a phase-locked loop (PLL). In practice, the proposed signal generator is applicable to any application that requires an output signal having a higher reference frequency for in-band noise reduction. To put it simply, the present invention has no limitations on the use of the output signal (or the refined output signal) generated from the proposed signal generator. Any application using the proposed signal generator falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal generator for generating an output signal having a waveform with transition edges according to an oscillating signal having a waveform, the signal generator comprising:
   a plurality of edge sampling circuits, each configured to receive the oscillating signal and a bias voltage, sample the waveform of the oscillating signal using the bias voltage to generate at least one of a rising edge and a falling edge in one cycle of the oscillating signal, and output a sampled signal using the at least one of the rising edge and the falling edge; and
   an edge combining circuit, configured to combine a plurality of sampled signals generated by the edge sampling circuits, respectively, to generate the output signal;
   wherein the edge sampling circuits comprise at least a first edge sampling circuit and a second edge sampling circuit, and the signal generator further comprises:
      a voltage generator, configured to generate a first bias voltage to the first edge sampling circuit and generate a second bias voltage to the second edge sampling circuit;
      wherein the first bias voltage is different from the second bias voltage, the first edge sampling circuit obtains a first set of a rising edge and a falling edge in a cycle of the oscillating signal according to the first bias voltage, the second edge sampling circuit obtains a second set of a rising edge and a falling edge in the cycle of the oscillating signal according to the second bias voltage, and the first set of the rising edge and the falling edge is different from the second set of the rising edge and the falling edge.

2. The signal generator of claim 1, wherein a frequency value of the output signal is higher than a frequency value of the oscillating signal.

3. The signal generator of claim 2, wherein the frequency value of the output signal is an integer multiple of the frequency value of the oscillating signal.

4. The signal generator of claim 1, further comprising:
   a calibration circuit, configured to monitor at least one of a first sampled signal generated from the first edge sampling circuit and a second sampled signal generated from the second edge sampling circuit to generate a control signal;
   wherein the voltage generator is further configured to calibrate at least one of the first bias voltage and the second bias voltage in response to the control signal.

5. The signal generator of claim 1, wherein each of the edge sampling circuits is configured to sample the waveform of the oscillating signal at different phases in one cycle of the oscillating signal; and each of the different phases is closer to 0° or 180° than 90° when being within a range from 0° to 180°, and is closer to 180° or 360° than 270° when being within a range from 180° to 360°.

6. The signal generator of claim 5, wherein the edge combining circuit is configured to generate the output signal having a uniform distribution of falling edges and rising edges within a period corresponding to one cycle of the oscillating signal.

7. The signal generator of claim 5, wherein the edge combining circuit is configured to generate the output signal having a non-uniform distribution of falling edges and rising edges within a period corresponding to one cycle of the oscillating signal.

8. The signal generator of claim 1, wherein the edge combining circuit is configured to generate the output signal having a non-uniform distribution of falling edges and rising edges within a period corresponding to one cycle of the oscillating signal.

9. The signal generator of claim 8, further comprising:
a multiplying delay-locked loop (MDLL) with a re-alignment voltage-controlled oscillator (VCO), configured to receive the output signal and output a refined output signal having a uniform distribution of falling edges and rising edges within a period corresponding to one cycle of the oscillating signal.

10. A signal generating method for generating an output signal having a waveform with transition edges according to an oscillating signal having a waveform, the signal generating method comprising:
performing a plurality of edge sampling operations upon the oscillating signal, respectively, wherein each of the edge sampling operations comprises a step of sampling the waveform of the oscillating signal using a bias voltage to generate at least one of a rising edge and a falling edge in one cycle of the oscillating signal, and a step of outputting a sampled signal using the at least one of the rising edge and the falling edge; and
combining a plurality of different sampled signals generated by the edge sampling operations, respectively, to generate the output signal;
wherein the edge sampling operations comprise at least a step of first edge sampling and a step of second edge sampling, and the signal generating method further comprises:
providing a first bias voltage for the first edge sampling; and
providing a second bias voltage for the second edge sampling;
wherein the first bias voltage is different from the second bias voltage, a first set of a rising edge and a falling edge in a cycle of the oscillating signal is obtained according to the first bias voltage, a second set of a rising edge and a falling edge in the cycle of the oscillating signal is obtained according to the second bias voltage, and the first set of the rising edge and the falling edge is different from the second set of the rising edge and the falling edge.

11. The signal generating method of claim 10, wherein a frequency value of the output signal is higher than a frequency value of the oscillating signal.

12. The signal generating method of claim 11, wherein the frequency value of the output signal is an integer multiple of the frequency value of the oscillating signal.

13. The signal generating method of claim 10, further comprising:
monitoring at least one of a first sampled signal generated from the step of first edge sampling and a second sampled signal generated from the step of second edge sampling to calibrate at least one of the first bias voltage and the second bias voltage.

14. The signal generating method of claim 10, wherein each of the edge sampling operations comprises the step of sampling the waveform of the oscillating signal at different phases in one cycle of the oscillating signal, and each of the different phases is closer to 0° or 180° than 90° when being within a range from 0° to 180° and is closer to 180° or 360° than 270° when being within a range from 180° to 360°.

15. The signal generating method of claim 14, wherein the output signal is of a uniform distribution of falling edges and rising edges within a period corresponding to one cycle of the oscillating signal.

16. The signal generating method of claim 14, wherein the output signal is of a non-uniform distribution of falling edges and rising edges within a period corresponding to one cycle of the oscillating signal.

17. The signal generating method of claim 10, wherein the output signal is of a non-uniform distribution of falling edges and rising edges within a period corresponding to one cycle of the oscillating signal.

18. The signal generating method of claim 17, further comprising:
utilizing a multiplying delay-locked loop (MDLL) with a re-alignment voltage-controlled oscillator (VCO) to receive the output signal and output a refined output signal having a uniform distribution of falling edges and rising edges within a period corresponding to one cycle of the oscillating signal.

19. A signal generator for generating an output signal having a waveform with transition edges according to an oscillating signal having a waveform, the signal generator comprising:
a plurality of edge sampling circuits, each configured to receive the oscillating signal and a bias voltage, sample the waveform of the oscillating signal using the bias voltage to generate at least one of a rising edge and a falling edge in one cycle of the oscillating signal, and output a sampled signal using the at least one of the rising edge and the falling edge;
an edge combining circuit, configured to combine a plurality of sampled signals generated by the edge sampling circuits, respectively, to generate the output signal having a non-uniform distribution of falling edges and rising edges within a period corresponding to one cycle of the oscillating signal; and
a multiplying delay-locked loop (MDLL) with a re-alignment voltage-controlled oscillator (VCO), configured to receive the output signal and output a refined output signal having a uniform distribution of falling edges and rising edges within a period corresponding to one cycle of the oscillating signal.

20. A signal generating method for generating an output signal having a waveform with transition edges according to an oscillating signal having a waveform, the signal generating method comprising:
performing a plurality of edge sampling operations upon the oscillating signal, respectively, wherein each of the edge sampling operations comprises a step of sampling the waveform of the oscillating signal using a bias voltage to generate at least one of a rising edge and a falling edge in one cycle of the oscillating signal, and a step of outputting a sampled signal using the at least one of the rising edge and the falling edge;

combining a plurality of different sampled signals generated by the edge sampling operations, respectively, to generate the output signal, wherein the output signal is of a non-uniform distribution of falling edges and rising edges within a period corresponding to one cycle of the oscillating signal; and utilizing a multiplying delay-locked loop (MDLL) with a re-alignment voltage-controlled oscillator (VCO) to receive the output signal and output a refined output signal having a uniform distribution of falling edges and rising edges within a period corresponding to one cycle of the oscillating signal.

* * * * *